US005864179A

United States Patent [19]
Koyama

[11] Patent Number: 5,864,179
[45] Date of Patent: Jan. 26, 1999

[54] ALUMINUM LIKE METAL WIRING FOR SEMICONDUCTOR DEVICES

[75] Inventor: Kazuhide Koyama, Kanagawa, Japan

[73] Assignee: Sony Corporation, Japan

[21] Appl. No.: 669,924

[22] Filed: Jun. 25, 1996

[30] Foreign Application Priority Data

Jun. 30, 1995 [JP] Japan ..................................... 7-165220

[51] Int. Cl.[6] .................................................. H01L 23/532
[52] U.S. Cl. .......................... 257/767; 257/773; 257/775; 257/765
[58] Field of Search ..................................... 257/765, 750, 257/751, 776, 767, 773, 775

[56] References Cited

U.S. PATENT DOCUMENTS

| 4,561,009 | 12/1985 | Yonezawa, et al. | 257/765 |
| 5,506,450 | 4/1996 | Lee, et al. | 257/776 |

OTHER PUBLICATIONS

Tao, et al., "Comparison of Electromigration reliability of Tonasten and Aluminum Vias under DC and Time–Varying current Stressing." Proceeding of the 30th IEEE International Reliability Physics Symposium, 1992, pp. 338–343.

*Primary Examiner*—David B. Hardy
*Attorney, Agent, or Firm*—Ronald P. Kananen

[57] ABSTRACT

In a wiring system provided by the present invention, a first conductive wire is provided on a surface on one side of an dielectric layer of a semiconductor device, a second conductive wire made of an Al like metal is provided on a surface on the other side of the dielectric layer, a connection hole is drilled through the dielectric layer, the first and second conductive wires are connected to each other through the connection hole, and a compensation pattern made of the Al like metal is created in the second conductive wire, so that generation of voids in the Al like metal of the second conductive wire due to an electro-migration phenomenon is prevented, enhancing the reliability of the wire.

12 Claims, 9 Drawing Sheets

F I G. 1
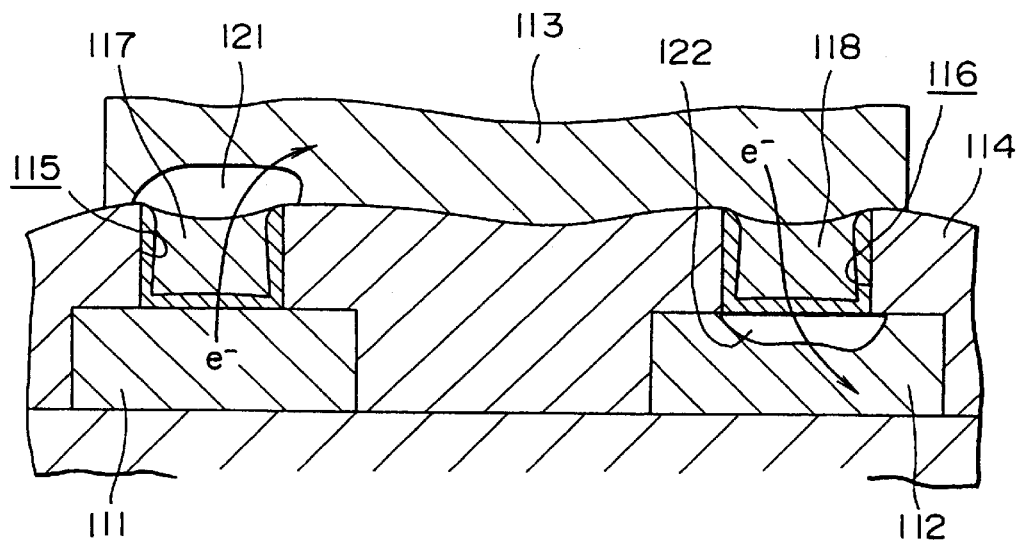
F I G. 2
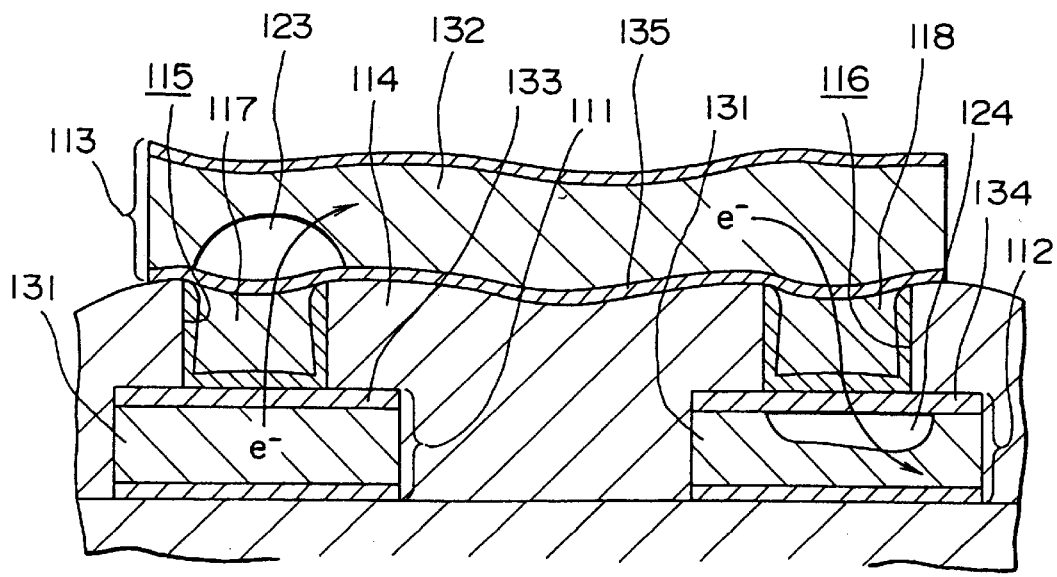

EM ATOMIC CURRENT

DEPLETED   INTEGRATED

ATOMIC CURRENT INDUCED BY STRESS GRADIENT

ALUMINUM LIKE METAL WIRING FOR SEMICONDUCTOR DEVICES

BACKGROUND OF THE INVENTION

In general, the present invention relates to a multilayer wiring structure of a semiconductor device. In particular, the present invention relates to aluminum like metal wiring for semiconductor devices.

With high integration of semiconductor devices, the dimension rule gets thinner and thinner and it becomes necessary to connect upper-layer wires to lower-layer wires wiring with a wiring material through via holes and contact holes with a high aspect ratio in a wiring process. The contact holes and via holes are referred to hereafter simply as connection holes, a generic name for both.

One of the technologies for creating wires embedded into the connection holes described above is the sputtering technique. In general, a technique of embedding a refractory metal to a connection hole by means of the CVD (the abbreviation of Chemical Vapor Deposition) method is adopted. The CVD method is an excellent chemical vapor phase growth method for getting a metal embedded into a connection hole with a high aspect ratio.

In the process technology, the chemical vapor phase growth method of a refractory metal is adopted. One of known processes is a selected CVD process which adopts a combination of a blanket CVD method and an etch-back method. With this technique, a so-called plug is created in a connection hole by getting a refractory metal embedded into the connection hole.

In addition, the so-called barrier metal layered structure is adopted. In the barrier metal layered structure, a conductive refractory metal or compound such as titanium (Ti), titanium nitride (TiN), titanium oxide-nitride (TiON) and titanium tungsten (TiW) is created on the upper-surface and lower-surface sides of the aluminum (Al) like wire. In the barrier metal layered structure, a redundancy effect prevents the entire wiring from being broken even if the Al like wire itself is broken.

On the other hand, there is a method by which an upper-layer wire material is embedded in a connection hole. To be more specific, an Al reflow technology has been developed for flowing the upper-layer wiring material into a connection hole through heat treatment during or after a process of growing an Al like metal film. It should be noted that, in some cases, the technique of flowing the upper-layer wiring material into a connection hole during the growing process is called a high-temperature sputtering method while the technique of flowing the upper-layer wiring material into a connection hole after the growing process is referred to as the Al reflow method. In the following description, none the less, both the techniques are referred to as the Al reflow method.

With the technology for getting an Al like metal embedded into a connection hole by means of the Al reflow method, the Al like metal is heated to a temperature higher than the recrystallization temperature of the Al like metal but lower than the fusing point of the Al like metal during or after the growing process in order to flow the Al like metal. It should be noted that the recrystallization temperature varies from compound to compound but it is normally higher than 350° C. Then, the flowing Al like metal is directed to get embedded into the connection hole.

In a wiring structure wherein a plug is created from a refractory metal embedded in a connection hole by a CVD method, however, voids result due to an electromigration (EM) phenomenon.

This phenomenon is studied and reported in documents such as the Proceedings of the 30th IEEE International Reliability Physics Symposium, 1992, Pages 338 to 343 authored by Jiang Tao et al.

An example of the void generation is explained by referring to FIGS. 1 to 3. As shown in FIG. 1, lower-layer wires 111 and 112 made of an Al like metal and an upper-layer wire 113 also made of an Al like metal are connected to each other by plugs 117 and 118 made of a refractory metal created inside connection holes 115 and 116 which are created through an interlayer dielectric film 114 between the lower-layer wires 111 and 112 and the upper-layer wire 113. In such a wiring structure, a current flows for example from the lower-layer wire 112 to the upper-layer wire 113 through the plug 118 and then from the upper-layer wire 113 to the lower-layer wire 111 through the plug 117. In the figure, the paths of electrons $e^-$ are indicated by arrows. As shown in the figure, the electrons $e^-$ flow from the lower-layer wire 111 to the upper-layer wire 113 through the plug 117 and then from the upper-layer wire 113 to the lower-layer wire 112 through the plug 118. Since the electrons $e^-$ flow through the plugs 117 and 118, EM (electromigration) phenomena occur therein. Accordingly, Al migrates from the upper-layer wire 113 in contact with the plug 117 and the lower-layer wire 112 in contact with the plug 118. For this reason, the amounts of Al at those portions become insufficient, resulting in voids 121 and 122 therein. As a result, the upper-layer and lower-layer wires 113 and 112 are broken, causing reliability to deteriorate.

On the other hand, voids also result from an EM phenomenon even in a barrier metal layered structure.

The generation of such voids is explained as follows. As shown in FIG. 2, main portions of lower-layer wires 111 and 112 are made of an Al like metal 131 whereas a main portion of an upper-layer wire 113 is made of an Al like metal 132. The lower-layer wires 111 and 112 and the upper-layer wire 113 are connected to each other by plugs 117 and 118 made of a refractory metal created inside connection holes 115 and 116 which are created through an interlayer dielectric film 114 between the lower-layer wires 111 and 112 and the upper-layer wire 113. Barrier metal layers 133 and 134 each made of a refractory metal or a compound are created on the upper surfaces of the lower-layer wires 111 and 112 respectively. On the other hand, a barrier metal layer 135 made of a refractory metal or a compound is created on the lower surface of the upper-layer wires 113. In this barrier metal layered structure, a wire is not broken easily due to an EM phenomenon in comparison with the wiring structure shown in FIG. 1. None the less, a current flows through the Al like metals 131 and 132 which each have a low resistance.

For example, a current flows from the lower-layer wire 112 to the upper-layer wire 113 through the plug 118 and then from the upper-layer wire 113 to the lower-layer wire 111 through the plug 117. In this case, electrons $e^-$ flow from the lower-layer wire 111 to the upper-layer wire 113 through the plug 117 and then from the upper-layer wire 113 to the lower-layer wire 112 through the plug 118. Such a current causes EM deterioration to occur at the upper-layer wire 113 in contact with the plug 117 and the lower-layer 112 in contact with the plug 118, resulting in voids 123 and 124 therein. As a result, reliability deteriorates.

In addition, in a wiring structure wherein an Al like metal is embedded into a connection hole by using the Al reflow technique, voids are also generated as well due to an EM phenomenon.

The generation of voids in a wiring structure built by means of the Al reflow technique is explained by referring to FIG. 3. As shown in the figure, lower-layer wires 111 and 112 made of an Al like metal and an upper-layer wire 113 also made of an Al like metal are connected to each other by connection holes 115 and 116 which are created through an interlayer dielectric film 114 between the lower-layer wires 111 and 112 and the upper-layer wire 113. In addition, in order to improve the wettability between the upper-layer wire 113 and the underlying interlayer dielectric film 114 as well as to enhance the EM-proof characteristic and the endurance characteristic against stress induced voiding of the upper-layer wire 113, an adhesion layer (including a barrier metal) 141 is normally created beneath the upper-layer wire 113. Typically, the adhesion layer is made of titanium (Ti) or titanium nitride (TiN). Much like the configuration shown in FIG. 8, for example, a current flows from the lower-layer wire 112 to the lower-layer wire 111 through the upper-layer wire 113. In such a case, EM deterioration occurs at the upper-layer wire 113 inside the connection hole 115 and at the lower-layer wire 112 beneath the connection hole 116, resulting in voids 125 and 126 therein. As a result, reliability deteriorates.

In general, an EM phenomenon occurs when electrons collide with metal atoms, in this case, Al atoms, causing the atoms to migrate due to an electron wind force (or electrons' colliding force). If EM phenomena occur uniformly over the entire wiring structure, the atom concentration in the wiring structure itself does not change, generating no voids therein. In actuality, however, a portion in which EM phenomena do not occur uniformly exists in the wiring structure.

In a portion in which there is a biggest difference in the number of migrating atoms, that is, in a portion in which the number of departing atoms is largest in comparison with the number of incoming atoms, a failure can be said to occur due to an EM phenomenon.

In each of the connection holes shown in FIGS. 1 to 3, more than one types of metals each with a high fusing point other than the Al like metal or a compound of such metals exist, being crossed by the current path. Thus, a boundary surface, where electrons flow out from the metals with a high fusing point or a compound of such metals to the Al like metal layer, has a most insufficient number of Al atoms. As a result, an EM failure occurs therein.

FIGS. 4-1 to 4-4 show Al-atom flows caused by an EM phenomenon. As shown in FIG. 4-1, an atomic current flows for example in a direction indicated by an arrow. As shown in FIG. 4-2, a portion with an insufficient number of Al atoms is depletion. A depletion region is caused by migration of atoms from the depletion region to a destination called an accumulation region, resulting in a difference in Al-atom concentration between the Al like metals at the depletion and accumulation regions. The difference in Al-atom concentration in turn gives rise to a stress gradient as is shown in FIG. 4-3. For this reason, a force works to push back Al atoms in the reverse direction from the accumulation region with an excess amount of Al metal to the depletion region with an insufficient amount of Al metal. The stress gradient induces an atomic current in the reverse direction as shown in FIG. 4-4. The flow of Al atoms in the reverse direction is normally called a back flow. Thus, the final EM phenomenon must be considered to be attributed to a net atomic current which is equal in quantity to the difference between the atomic flow caused by the force of the electron wind (that is, the colliding force of electrons) and the back flow.

FIG. 5-1 is a diagram roughly showing a cross section of a wiring structure whereas FIG. 5-2 is a rough layout diagram thereof. On a boundary surface between an Al like metal 211 and a refractory metal 213 above a connection hole 213, a stress gradient which is developed toward a region in the Al like metal 211 with an insufficient number of Al atoms exits in an area outside the current path. It should be noted that electrons e_ flow in a direction opposite to that of the current. As a result, Al atoms are supplied to the region with an insufficient number of Al atoms from all the surroundings of the portion due to this stress gradient. In addition, the area of the Al like metal 211 outside the current path, in which this stress gradient is developed, has only a length of the order of w1, an aligment margin for the exposure apparatus. Accordingly, a void 214 is observed in the Al like metal 211 during examination of the surroundings of the connection hole after an EM test.

OBJECT AND SUMMARY OF THE INVENTION

It is an object of the present invention to provide EM-proof Al like metal wiring to semiconductor devices.

According to the invention, there is provided a Al like metal wiring created on a surface on one side of an dielectric film of a semiconductor device connected to a conductor created on a surface on the other side of said dielectric film through a connection hole drilled through said dielectric film, comprising a compensation pattern created from an Al like metal at a location in close proximity to said connection hole.

In this Al like metal wiring for semiconductor devices, even if the Al at the location in close proximity to the connection hole on the Al like metal wiring migrates in a direction opposite to the flowing direction of a current, that is, in the direction of an electron flow, due to an EM phenomenon, the compensation pattern created on the Al like metal wiring from an Al like metal at the location in close proximity to the connection hole supplementarily supplies Al so as to prevent a void from being generated at the location in close proximity to the connection hole.

As a result, since failures caused by broken portions of the Al like metal wiring do not occur, reliability is improved.

BRIEF DESCRIPTION OF THE DRAWINGS

FIG. 1 is a diagram used for explaining problems with Al like metal wiring having plugs which problems are to be solved by the present invention;

FIG. 2 is a diagram used for explaining problems with Al like metal wiring having a barrier metal layer which problems are to be solved by the present invention;

FIGS. 4-1 to 4-4 are diagrams used for explaining an electromigration phenomenon;

FIGS. 5-1 and 5-2 are diagrams used for explaining a mechanism of void generation;

FIGS. 7-1 to 7-3 are diagrams used for explaining a process of manufacturing the first embodiment;

FIGS. 11-1 and 11-2 are diagrams used for explaining a process of manufacturing the third embodiment.

DETAILED DESCRIPTION OF THE PREFERRED EMBODIMENTS

Figure 6:
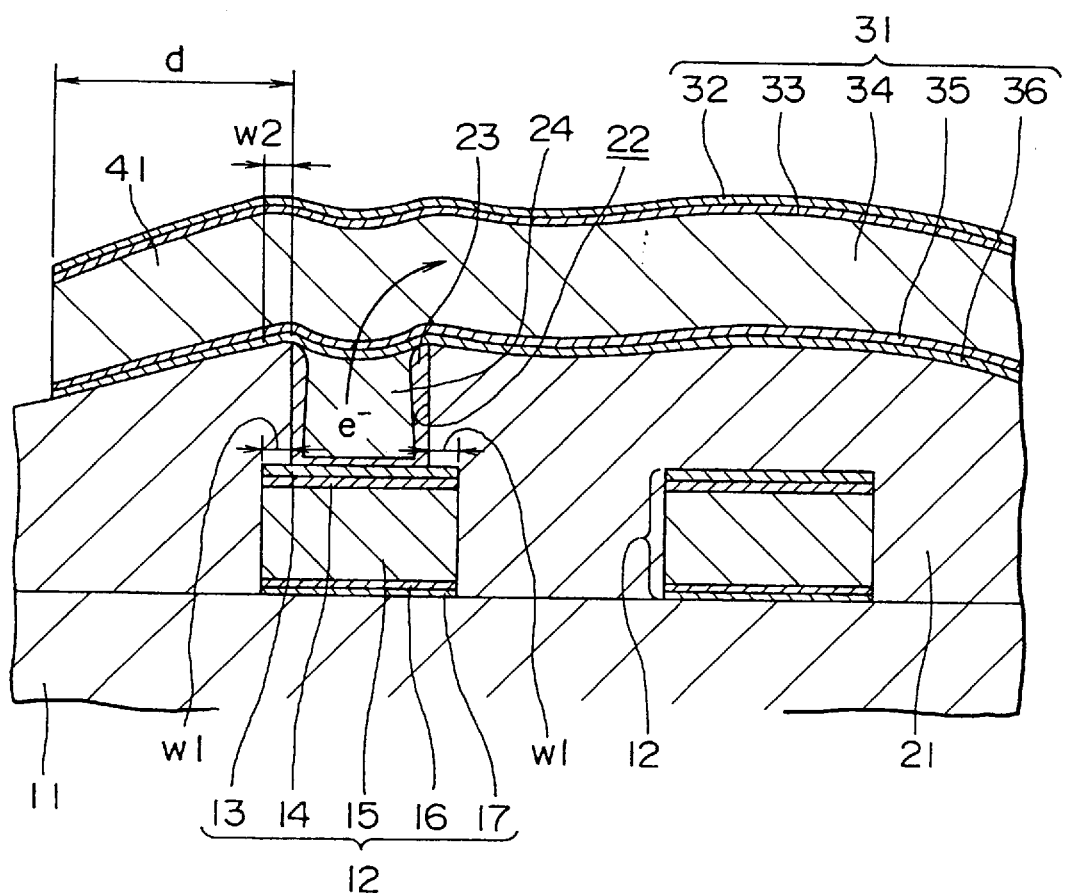
FIG. 6 is a configuration cross-sectional diagram used for explaining a first embodiment.

A first embodiment provided by the present invention is explained by referring to FIG. 6 which roughly shows a cross section of the configuration thereof.

As shown in FIG. 6, first wires 12 each serving as a conductor are created on a first insulation layer 11 used as an interlayer dielectric film in a direction perpendicular to the plane of the figure. The first insulation layer 11 is created on a silicon substrate which is not shown in the figure. Element isolating regions, gate wires, source/drain regions and other regions created on the silicon substrate are covered by the first insulation layer 11. In addition, contact holes are drilled through the first insulation layer 11. After a process of filling up the contact holes, the first wires 12 are created.

The first wire 12 is a layered film which consists of layers such as, starting with the upper-most layer, typically, a TiN film 13 with a typical thickness of 100 nm, a Ti film 14 with a typical thickness of 10 nm, an Al like metal film 15 made of an Al-0.5 % Cu material with a typical thickness of 500 nm, a TiN film 16 with a typical thickness of 20 nm and a Ti film 17 with a typical thickness of 20 nm.

The chemical symbols TiN, Ti and Al-0.5% Cu represent respectively titanium nitride, titanium and aluminum containing copper (Cu) at a content ratio of 0.5%. These symbols are used throughout the following description.

A second insulation film 21 is created, covering the first wires 12. Typically, the second insulation film 21 is a silicon-oxide layer with a typical thickness of 500 nm.

A connection hole 22, typically a via hole, is drilled through the second insulation film 21 at a location above each of the first wires 12.

It should be noted that, in this embodiment, the first wire 12 is created to have a size larger than the connection hole 22 by a margin w1 of typically 0.15 $\mu$m. The margin w1 is taken into consideration so as to allow for normal alignment of a shift of the first wire 12 relative to the connection hole 22.

An adhesion layer 23 made of typically TiN is created on the inner wall of the connection hole 22. In addition, a conductive plug 24 typically made of tungsten is created inside the connection hole 22.

A second wire 31 is created on the connection hole 22 above the second insulation film 21. The second wire 31 is connected to the plug 24. Much like the first wire 12, the second wire 31 has a layered structure which consists of layers such as, starting with the upper-most layer, typically, a TiN film 32 with a typical thickness of 100 nm, a Ti film 33 with a typical thickness of 10 nm, an Al like metal film 34 made of an Al-0.5% Cu material with a typical thickness of 500 nm, a TiN film 35 with a typical thickness of 20 nm and a Ti film 36 with a typical thickness of 20 nm.

It should be noted that, in this embodiment, the second wire 31 is created to overlap the connection hole 22 by a margin w2 of typically 0.15 $\mu$m. The margin w2 is taken into consideration so as to allow for normal alignment of a shift of the second wire 31 relative to the connection hole 22.

In addition, a compensation pattern 41 is created in the second wire 31 at a portion in close proximity to the connection hole 22 which portion has all but nothing to do with a path of a current flowing from the second wire 31 to the first wire 12. The compensation pattern 41 typically has the same structure as that of the second wire 31. For this reason, the compensation pattern 41 is created by merely extending the Al like metal film 34 of the second wire 31 into a main portion of the compensation pattern 41. As shown in the figure, the length d of the compensation pattern 41 as measured from the connection hole 22 is greater than the margin w2 which allows for normal shift alignment of the second wire 31.

It should be noted that the compensation pattern 41 can be created at any location as long as the location has all but nothing to do with the path of the current flowing from the second wire 31 to the first wire 12.

As described above, in the wiring structure of the first embodiment, the compensation pattern 41 is created by merely extending the Al like metal film 34 of the second wire 31 into a main portion of the compensation pattern 41 which film 34 is made of an Al-0.5% Cu material. As a result, even if the Al of the Al like metal film 34 at the location in close proximity to the connection hole 22 migrates in a direction opposite to the flowing direction of the current, that is, in the direction of a flow of electrons $e^-$ shown by an arrow in the figure, due to an EM phenomenon, the compensation pattern 41 created in the Al like metal film 34 at the location in close proximity to the connection hole 22 supplementarily supplies Al so as to prevent a void from being generated in the Al like metal film 34 at the location in close proximity to the connection hole 22.

In related art, the overlap portion of a wire on a connection hole has only a margin in a direction other than the current direction which margin allows for shift alignment of an exposure apparatus during a lithographic process. In the case of the present invention, however, a compensation pattern 41 is created outside the direction of the current path, enlarging the supplying source of Al atoms. As a result, the EM life of a wire at the connection hole 22, that is the second wire 31, can be lengthened.

Figure 3:
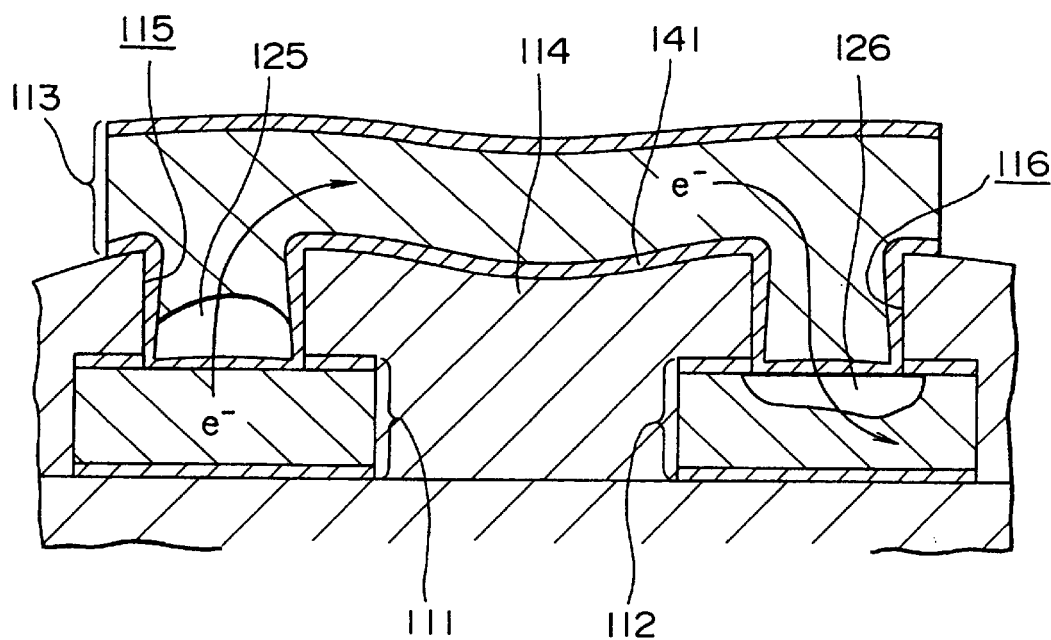
FIG. 3 is a diagram used for explaining problems with Al like metal wiring created by means of an Al reflow technique which problems are to be solved by the present invention.
Figures 1, 4:
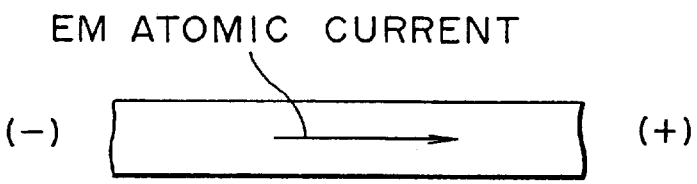
Figures 1, 7:
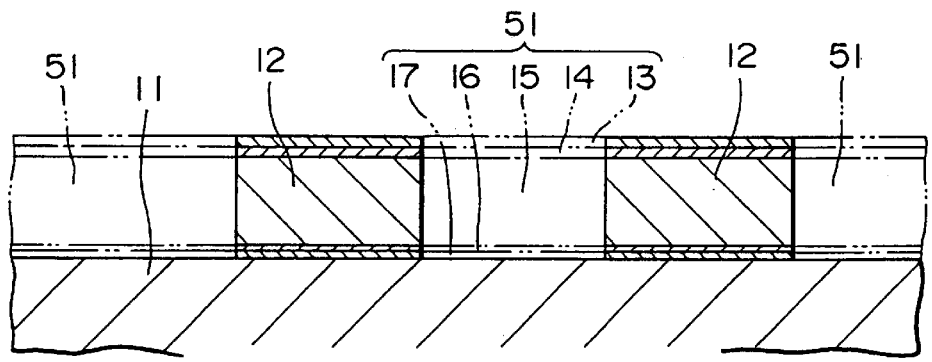
Figures 2, 7:
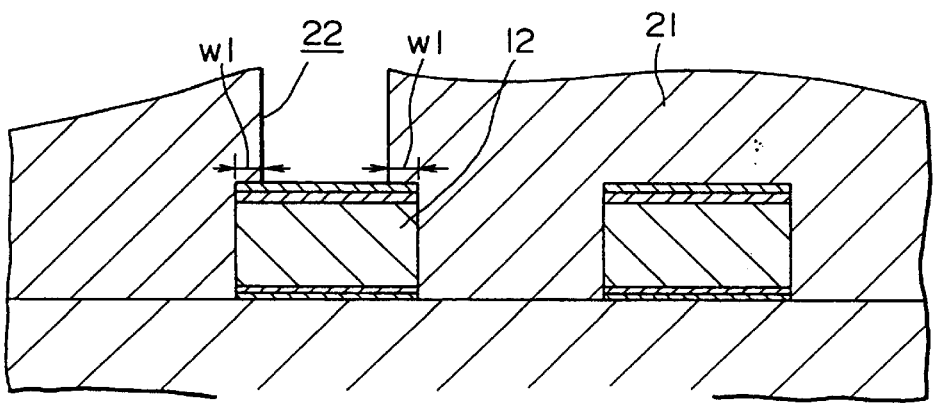
Figures 3, 7:
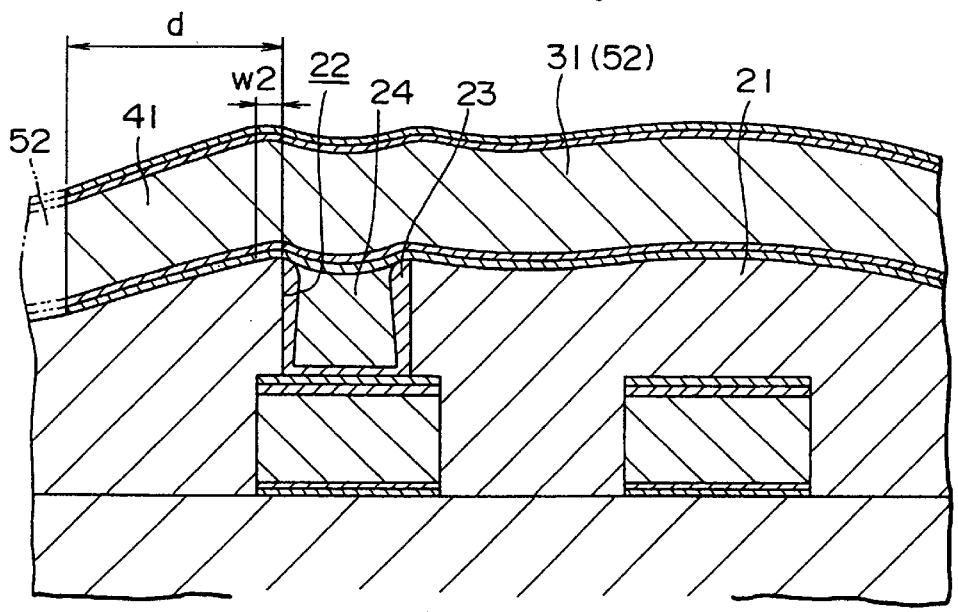

Next, a method of manufacturing the wiring structure shown in FIG. 6 is explained by referring to FIGS. 7-1 to 7-3. Components identical with those shown in FIG. 6 are denoted in FIGS. 7-1 to 7-3 by the same reference numerals as those used in FIG. 6.

As shown in FIG. 7-1, a first layered film 51 is created on the first insulation film 11 serving as an interlayer insulating film by means of the sputtering method by stacking typically the Ti film 17 with a typical thickness of 20 nm, the TiN film 16 with a typical thickness of 20 nm, the Al like metal film 15 made of an Al-0.5% Cu material with a typical thickness of 500 nm, the Ti film 14 with a typical thickness of 10 nm and the TiN film 13 with a typical thickness of 100 nm, one film on another, in the listed order.

It should be noted that the first insulation layer 11 is created on a silicon substrate which is not shown in the figure. Element isolating regions, gate wires, source/drain regions and other regions created on the silicon substrate are covered by the first insulation layer 11. In addition, contact holes, also not shown in the figure, are drilled through the first insulation layer 11. Then, after a process of filling up the contact holes, the first layered film 51 is created.

Next, typical conditions for creating the Ti films 14 and 17 by means of the sputtering method described above are explained. Argon (Ar) is used as a sputtering gas at a flow rate of 100 sccm in a sputtering environment with a pressure of 0.4 Pa, a direct-current (DC) power of 5 kW and a substrate heating temperature of 150° C. It should be noted that the unit sccm represents a volume flow rate in terms of $cm^3$/min in a standard state.

Next, typical conditions for creating the Ti films 13 and 16 by means of the sputtering method described above are explained. Argon (Ar) and nitrogen ($N_2$) are used as sputtering gases at flow rates of 30 and 80 sccm respectively in a sputtering environment with a pressure of 0.4 Pa, a direct-current (DC) power of 5 kW and a substrate heating temperature of 150° C.

Next, typical conditions for creating the Al-0.5% Cu film of the Al like metal film 15 are explained. Argon (Ar) is used as a sputtering gas at a flow rate of 100 sccm in a sputtering environment with a pressure of 0.4 Pa, a direct-current (DC) power of 20 kW and a substrate heating temperature of 150° C.

It should be noted that the thickness of each layer is set by controlling the sputtering time.

Later on, by using the lithography technologies such as resist coating, exposure, development and baking as well as the etching technique, a portion of the first layered film 51 indicated by a double-dotted line is removed to create the first wire 12.

Typical etching conditions used at that time include the use of boron trichloride ($BCl_3$) and chlorine ($Cl_2$) as etching gases at flow rates of 60 and 90 sccm respectively in an etching environment with a pressure of 2 Pa and an RF power of 1.2 kw.

Figures 2, 4:
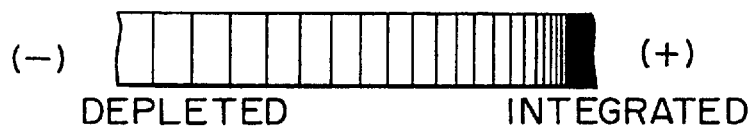
Figures 3, 4:
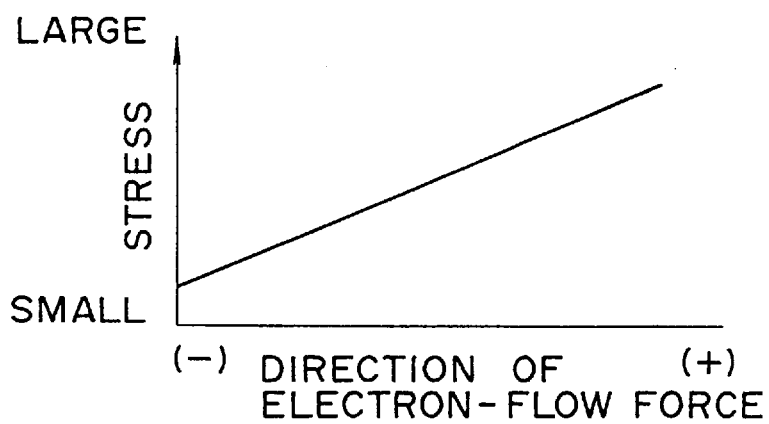
Figure 4:
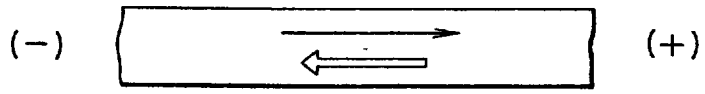
Figures 1, 5:
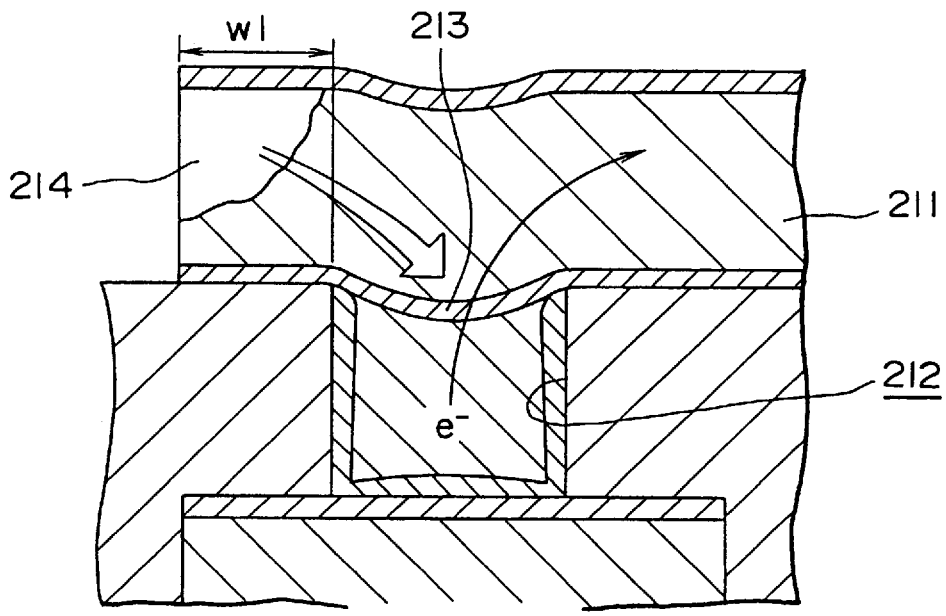
Figures 2, 5:
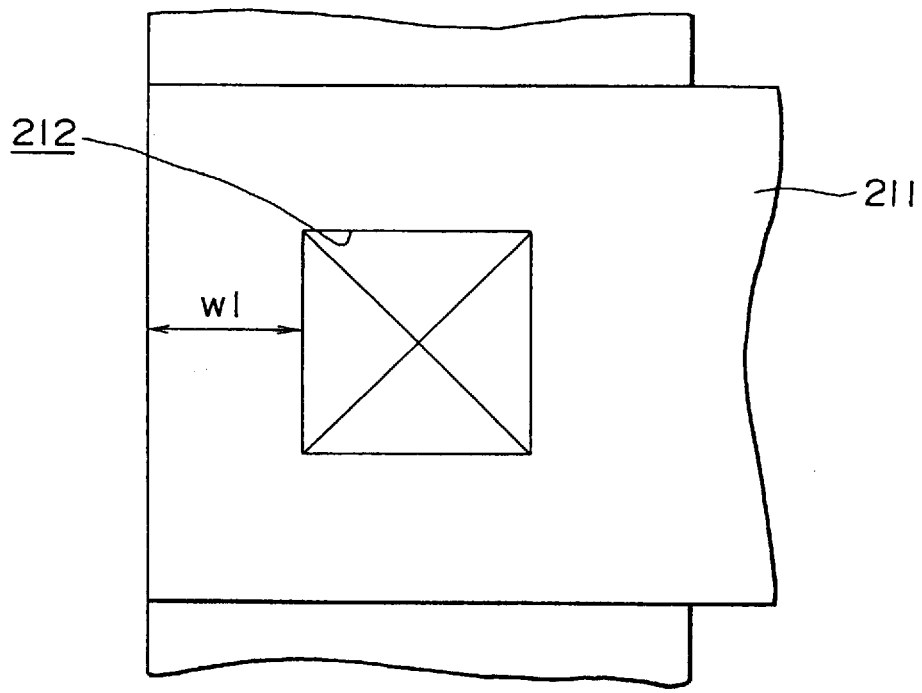

Then, the second insulation film 21 which serves as an interlayer dielectric film is created by piling up typically silicon oxide to a thickness of 500 nm by means of the CVD method as is shown in FIG. 7-2. Subsequently, by using the lithography technologies such as resist coating, exposure, development and baking as well as the etching technique, a connection hole 22, that is, a via hole, is drilled through a portion of the second insulation film 21 above the first wire 12.

It should be noted that, in this embodiment, the first wire 12 is created to have a size larger than the connection hole 22 by a margin w1 of typically 0.15 $\mu$m. The margin w1 is taken into consideration so as to allow for normal alignment of a shift of the first wire 12 relative to the connection hole 22.

Typical conditions for creating the second insulation film 21 by means of the CVD method include the use of mono-silane ($SiH_4$) and oxygen ($O_2$) and nitrogen ($N_2$) as reaction gases at flow rates of 250 and 250 and 100 sccm respectively in a film making environment with a pressure of 13.3 Pa and a film making temperature of 410° C.

As for etching conditions for creating the connection hole 22, typically, octafluorocyclobutane ($C_4F_8$) is used as an etching gas at a flow rate of 50 sccm in an etching environment with a pressure of 2 Pa and an RF power of 1.2 kW.

Later on, the TiN film 23 serving as an adhesion layer is created by means of the sputtering technique as is shown in FIG. 7-3. Then, after a tungsten film is created by using a blanket tungsten CVD method, the tungsten film is etched back to make a plug 24 from the tungsten film inside the connection hole 22. The figure shows an example in which the TiN film 23 created on the second insulation layer 21 is removed by an etching-back technique.

Typical conditions for creating the tungsten film by using a blanket tungsten CVD method include the use of tungsten hexafluoride ($WF_6$), hydrogen ($H_2$) and argon (Ar) as reaction gases at flow rates of 80, 500 and 2,800 sccm respectively in a film making environment with a pressure of 10.64 kPa and a film making temperature of 450° C.

As for etch-back conditions for creating the plug 24, typically, sulfur hexafluoride ($SF_6$) and argon (Ar) are used as etch-back gases at flow rates of 110 and 90 sccm respectively in an etch-back environment with a pressure of 35 Pa and an RF power of 275 W.

Subsequently, a second layered film 52 is created on the second insulation film 21 including the plug 23 by using a tungsten (W) sputtering method in the same way as the creation of the first layered film 51.

Later on, by using the lithography technologies such as resist coating, exposure, development and baking as well as the etching technique, a portion of a second layered film 52 indicated by a double-dotted line is removed, leaving the remaining second layered film 52 as the second wire 32. At the same time, the compensation pattern 41 is created in the second wire 31 at a portion in close proximity to the connection hole 22 which portion has all but nothing to do with a path of a current flowing from the second wire 31 to the first wire 12. As shown in the figure, the length d of the compensation pattern 41 as measured from the connection hole 22 is greater than the margin w2 which allows for normal shift alignment of the second wire 31.

Conditions for creating the second layered film 52 are the same as conditions for creating the first layered film 51. Since the explanation of the former is omitted, for details of the former, refer to the description of the latter given previously. In addition, since etching conditions for partially removing the second layered film 52 are also the same as etching conditions for partially removing the first layered film 51, the description of the latter is omitted as well.

Figure 8:
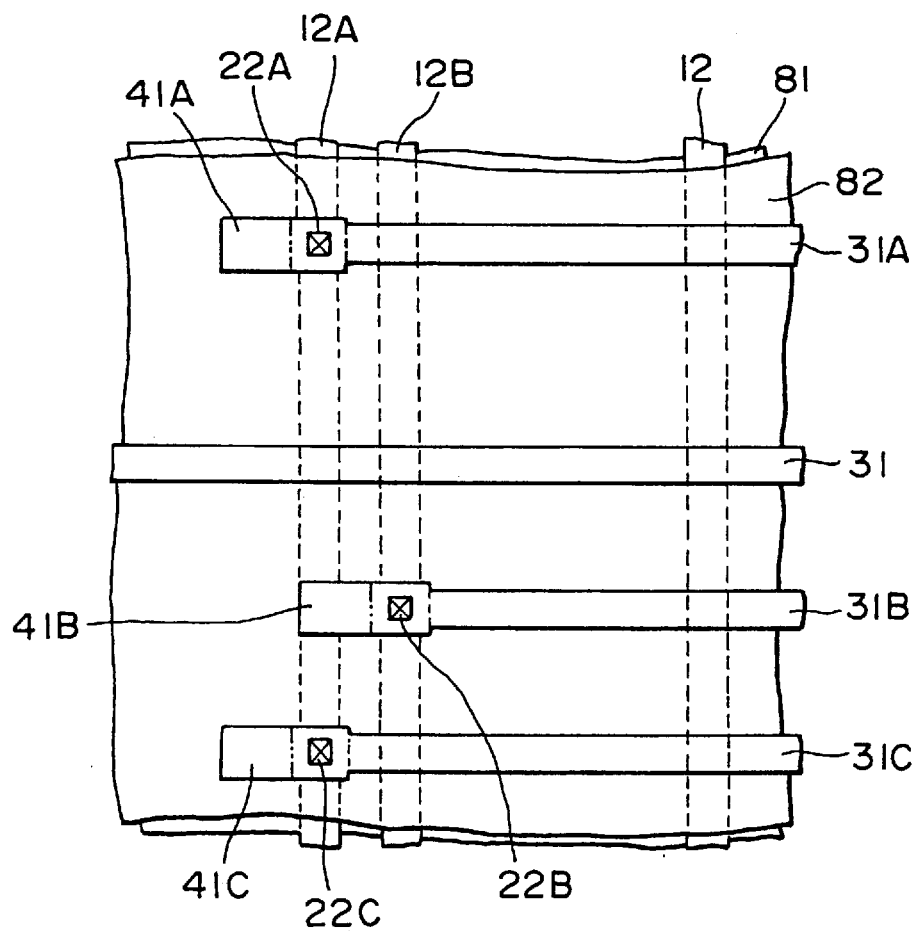
FIG. 8 is a diagram used for explaining an application example of the first embodiment.

Next, a typical circuit adopting a wiring structure wherein the connection hole 22 is created is explained by referring to a layout diagram of FIG. 8.

As shown in the figure, typically, a plurality of first wires 12A and 12B are created on a substrate 81 having an insulating surface. Then, an interlayer insulation film 82 (corresponding to the second insulation film 21) is created to cover the first wires 12A and 12B. It should be noted that the interlayer insulation film 82 itself is not shown in the figure. Connection holes 22A, 22B and 22C are then drilled through the interlayer insulation film 82 above the first wires 12A and 12B. Created on the interlayer insulation film 82 are a second wire 31A connected to the first wire 12A through the connection hole 22A, a second wire 31B connected to the first wire 12B through the connection hole 22B and a second wire 31C connected to the first wire 12A through the connection hole 22C. In addition, compensation patterns 41A to 41C are created on the second wires 31A to 31C respectively at locations in close proximity to the connection holes 22A to 22C. Also created are a plurality of first wires 12 other than the first wires 12A and 12B and a plurality of second wires 31 other than the second wires 31A to 31C. However, the creation of the other first wires 12 and the other second wires 31 is not explained here.

When currents flow from the second wire 31A to the first wire 12A through the connection hole 22A, from the second wire 31B to the first wire 12B through the connection hole 22B and from the second wire 31C to the first wire 12A through the connection hole 22C in the circuit described above, the generation of voids in the second wire 31A, 31B and 31C above the connection holes 22A, 22B and 22C respectively due to EM phenomena can be suppressed because the compensation patterns 41A to 41C supplementarily supply Al thereto. As a result, the EM life can be prolonged.

The circuit configuration described above can be used in building, for example, a peripheral circuit of a logic circuit. In many cases, compensation patterns can be created at least in one direction of each wire made of an Al like metal in such a circuit.

Figure 9:
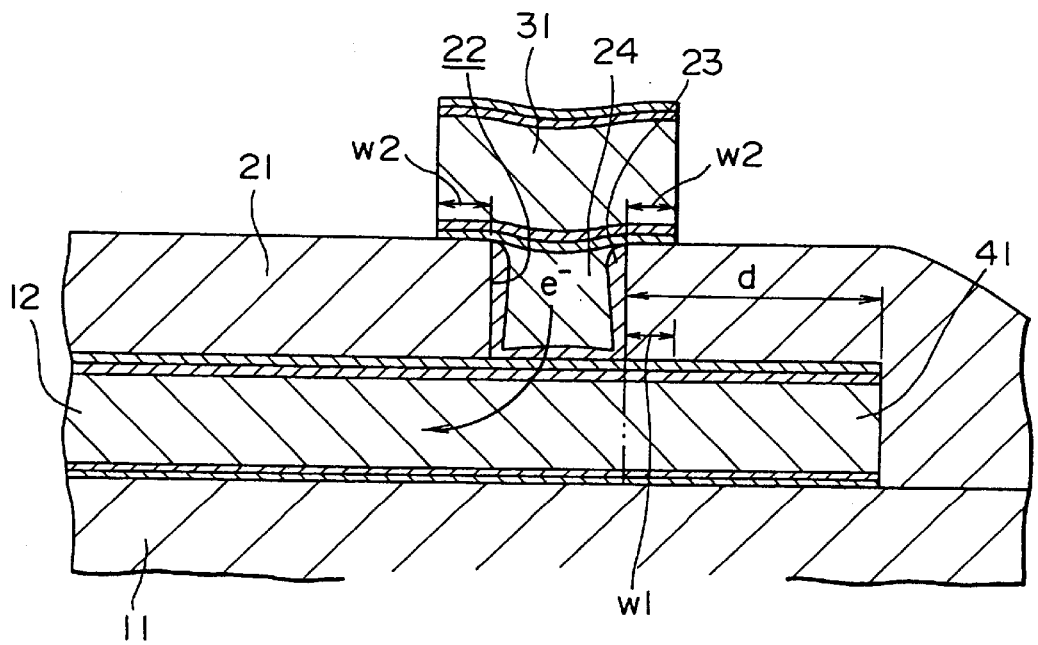
FIG. 9 is a configuration cross-sectional diagram used for explaining a second embodiment.

Next, a second embodiment implementing a typical wiring structure wherein currents flow in directions opposite to those of the first embodiment from the first wires to the second wires through the connection holes is explained by referring to a diagram of FIG. 9 which roughly shows a cross section of the configuration of the wiring structure.

Components identical with those shown in FIG. 6 are denoted in FIG. 9 by the same reference numerals as those used in FIG. 6.

As shown in FIG. 9, the first wire 12 serving as a conductor is created on the first insulation film 11 which is used as an interlayer dielectric film. Much like the first embodiment explained earlier, the first wire 12 has a layered structure. The first insulation film 11 is created on a silicon substrate which is not shown in the figure. Element isolating regions, gate wires, source/drain regions and other regions created on the silicon substrate are covered by the first insulation layer 11. In addition, contact holes are drilled through the first insulation layer 11. After a process of filling up the contact holes, the first wire 12 is created.

Then, the compensation pattern 42 is created in the first wire 12 at a portion in close proximity to the connection hole 22 which portion has all but nothing to do with a path of a current in the first wire 12. The connection hole 22 will be described later in detail. The compensation pattern 42 is a layered film including typically an Al like metal films which are used as materials for making the first wire 12. As shown in the figure, the length d of the compensation pattern 42 as measured from the connection hole 22 is greater than the margin w1 which allows for normal shift alignment of the first wire 12.

The second insulation film 21 is then created, covering the first wire 12 and the compensation pattern 42. Typically, the second insulation film 21 is a silicon-oxide layer with a typical thickness of 500 nm.

The connection hole 22, typically a via hole, is then drilled through the second insulation film 21 at a location above the first wire 12.

It should be noted that, in this embodiment, the first wire 12 is created to have a size larger than the connection hole 22 by a margin w2 of typically 0.15 μm. The margin w1 is taken into consideration so as to allow for normal alignment of a shift of the first wire 12 relative to the connection hole 22.

An adhesion layer 23 made of typically TiN is then created on the inner wall of the connection hole 22. In addition, a conductive plug 24 typically made of tungsten is created inside the connection hole 22.

In addition, the second wire 31 is created on the second insulation film 21 in a direction perpendicular to the plane of the figure. The second wire 31 is connected to the plug 24 created inside the connection hole 22. Typically, the second wire 31 has the same structure as the first wire of the first embodiment explained earlier.

It should be noted that, in this embodiment, the second wire 31 is created to overlap the connection hole 22 by a margin w2 of typically 0.15 μm. The margin w2 is taken into consideration so as to allow for normal alignment of a shift of the second wire 31 relative to the connection hole 22.

In the wiring structure of the second embodiment described above, the first wire 12 is made of an Al like material and the compensation pattern 42 which is also mostly made of the Al like material is created in the first wire 12 at a location in close proximity to the connection hole 22. As a result, even if the Al of the first wire 12 at the location in close proximity to the connection hole 22 migrates in a direction opposite to the flowing direction of a current, that is, in the direction of a flow of electrons e⁻ shown by an arrow in the figure, due to an EM phenomenon, the compensation pattern 42 created in the first wire 12 at the location in close proximity to the connection hole 22 supplementarily supplies Al so as to prevent a void from being generated in the first wire 12 at the location in close proximity to the connection hole 22.

In a combination of the first and second embodiments not shown in the figure, the compensation pattern 42 is created in the first wire 12 whereas the compensation pattern 41 is created in the second wire 31. In such a configuration, an EM-proof characteristic is obtained for both a current flowing from the first wire 12 to the second wire 31 and a current flowing from the second wire 31 to the first wire 12.

It should be noted that the method of manufacturing the second embodiment is the same as the method of manufacturing the first embodiment described earlier except that the compensation pattern 42 is created from a layered film for making the first wire 12 in a process of creating the first wire 12 and that the compensation pattern 41 is not created during a process of making the second wire 31.

It should be noted that, if the compensation pattern 41 needs to be created in the second wire 31, the manufacturing method for the first embodiment can be applied to a process of making the compensation pattern 41 in the second wire 31.

Figure 10:
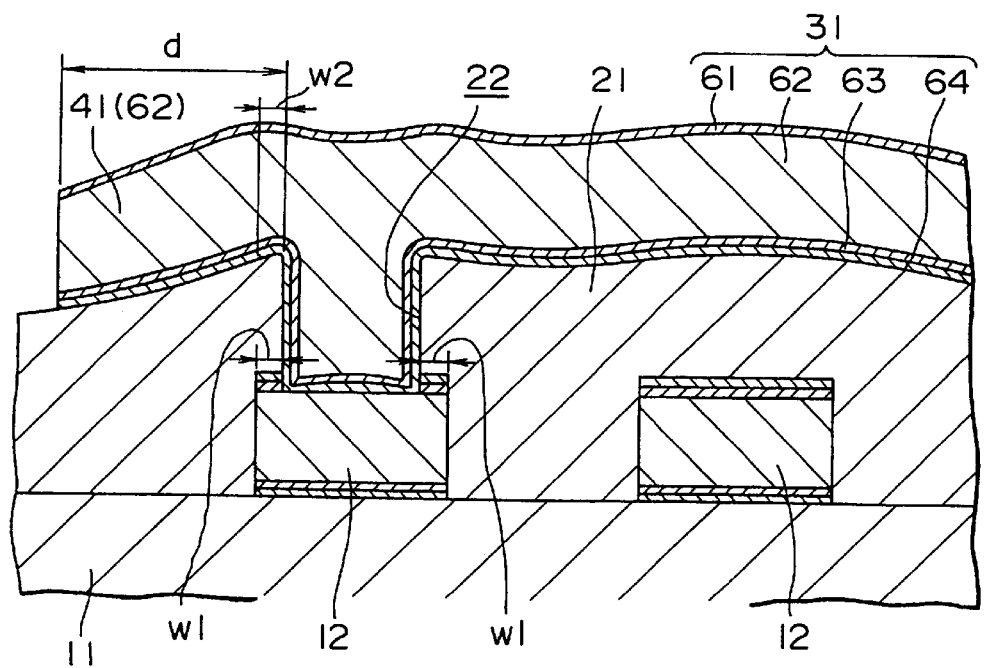
FIG. 10 is a configuration cross-sectional diagram used for explaining a third embodiment.

Next, a third embodiment implementing Al like metal wiring adopting the hightemperature Al reflow is explained by referring to FIG. 10 which shows roughly a cross-sectional diagram of the configuration thereof.

As shown in the figure, first wires 12 each serving as a conductor are created on a first insulation film 11 serving as an interlayer dielectric film in a direction perpendicular to the plane of the figure. The first wires 12 each have the same configuration as the first embodiment explained earlier. The first insulation film 11 is created on a silicon substrate which is not shown in the figure. Element isolating regions, gate wires, source/drain regions and other regions created on the silicon substrate are covered by the first insulation layer 11. In addition, contact holes are drilled through the first insulation layer 11. After a process of filling up the contact holes, the first wires 12 are created.

A second insulation film 21 is then created, covering the first wires 12. Typically, the second insulation film 21 is a silicon-oxide layer with a typical thickness of 500 nm.

A connection hole 22, typically a via hole, is then drilled through the second insulation film 21 at a location above one of the first wires 12.

It should be noted that, in this embodiment, the first wire 12 is created to have a size larger than the connection hole 22 by a margin w1 of typically 0.15 μm. The margin w1 is taken into consideration so as to allow for normal alignment of a shift of the first wire 12 relative to the connection hole 22.

A second wire 31 is further created on the second insulation film 21 which includes the inside of the connection hole 22. The second wire 31 is a layered film which consists of layers such as, starting with the upper-most layer, typically, a TiN film 61 with a typical thickness of 50 nm, an Al like metal film 62 made of an Al-0.5% Cu material with a typical thickness of 500 nm, a TiN film 63 with a typical thickness of 20 nm and a Ti film 64 with a typical thickness of 20 nm.

It should be noted that, in this embodiment, the second wire 31 is created to overlap the connection hole 22 by a margin w2 of typically 0.15 μm. The margin w2 is taken into consideration so as to allow for normal alignment of a shift of the second wire 31 relative to the connection hole 22.

In addition, a compensation pattern 41 is created in the second wire 31 at a portion in close proximity to the connection hole 22 which portion has all but nothing to do with a path of a current flowing from the second wire 31 to the first wire 12. The compensation pattern 41 typically has the same structure as that the second wire 31. For this reason, the main portion of the compensation pattern 41 is typically made of the Al like metal film 62 as is the case with the second wire 31. As shown in the figure, the length d of the compensation pattern 41 as measured from the connection hole 22 is greater than the margin w2 which allows for normal shift alignment of the second wire 31.

As described above, in the wiring structure of the third embodiment, the main portion of the compensation pattern 41 is created from the Al like metal film 62 in the second wire 31. As a result, even if the Al of the Al like metal film 62 at the location in close proximity to the connection hole 22 migrates in a direction opposite to the flowing direction of a current, that is, in the direction of a flow of electrons e⁻ shown by an arrow in the figure, due to an EM phenomenon, the compensation pattern 41 created in the Al like metal film 62 of the second wire 31 at the location in close proximity to the connection hole 22 supplementarily supplies Al so as to prevent a void from being generated in the Al like metal film 62 at the location in close proximity to the connection hole 22.

Figures 1, 11:
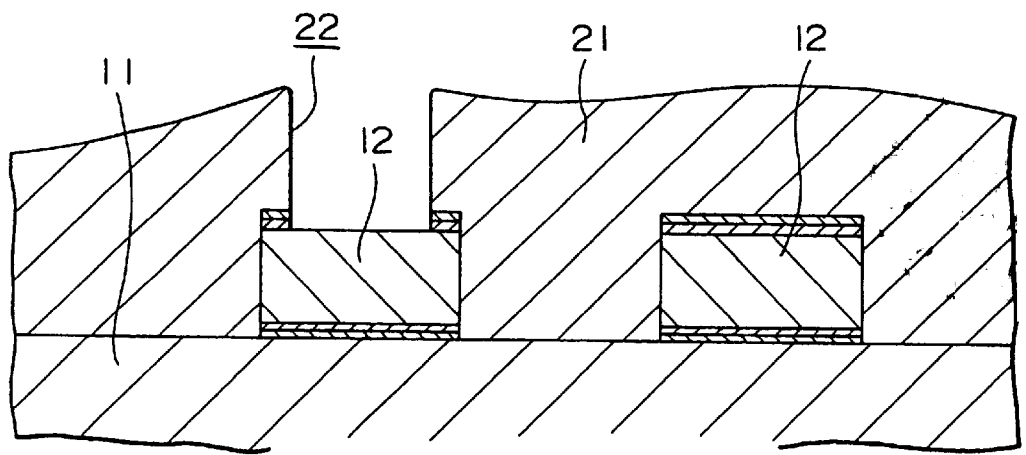
Figures 2, 11:
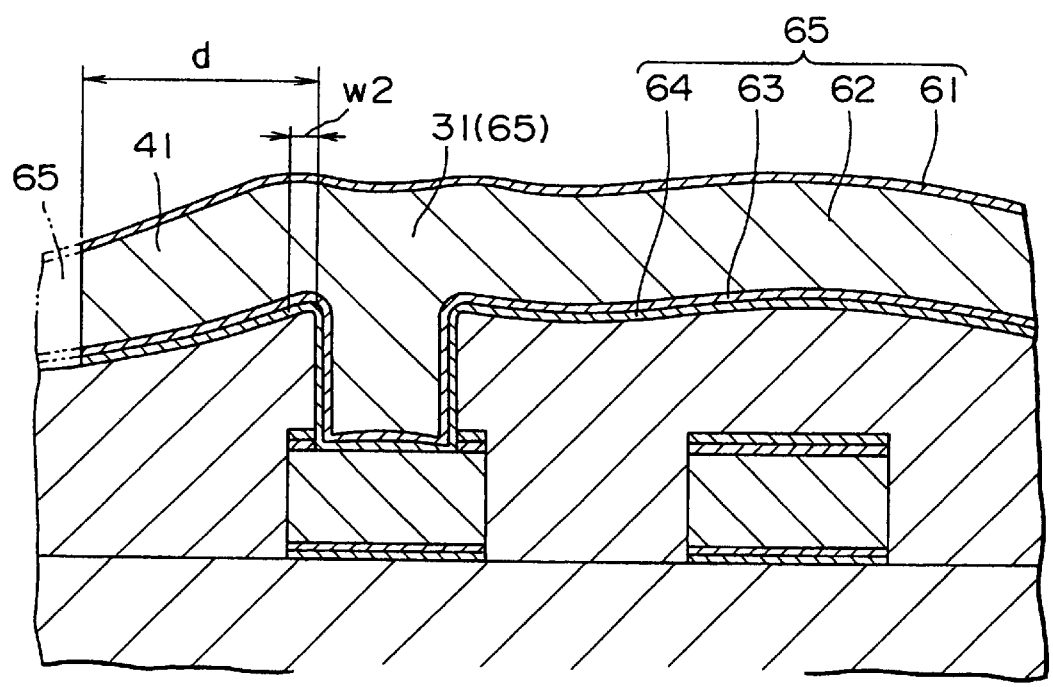

Next, a method of manufacturing the third embodiment described above is explained by referring to manufacturing process diagrams of FIGS. 11-1 and 11-2. Components identical with those shown in FIGS. 6 and 10 are denoted in FIGS. 11-1 and 11-2 by the same reference numerals as those used in the first and third embodiments shown in FIGS. 6 and 10.

Much like the first embodiment explained by referring to FIG. 6, the first wires 12 are created on the first insulation film 11 and, after creating the second insulation film 21, the connection hole 22 is created on one of the first wires 12 as shown in FIG. 11-1.

Later on, as shown in FIG. 11-2, by using the sputtering technique, typically the Ti film 64 with a typical thickness of 20 nm and the TiN film 63 with a typical thickness of 20 nm are created. Then, the Al like metal film 62 made of typically an Al-0.5% Cu material with a typical thickness of 500 nm is created by using the Al sputtering and hightemperature Al reflow method. Finally, the TiN film 61 with a typical thickness of 50 nm is created by using the sputtering technique. In this way, a layered film 65 is created by stacking the films 64, 63, 62 and 61 in the listed order.

Conditions for creating the Al like metal film 62 made of an Al-0.5% Cu material Ti 62 means of the sputtering method include the use of argon (Ar) as a sputtering gas at a flow rate of 100 sccm in a sputtering environment with a pressure of 0.4 Pa, a direct-current (DC) power of 20 kW and a substrate heating temperature of 150° C. Al reflow conditions include a heating environment in argon (Ar), a substrate heating temperature of 450° C. and a heating time of 2 minutes.

Conditions for making the TiN films 61 and 63 and the Ti film 64 are the same as the conditions adopted in the first embodiment described earlier.

It should be noted that the layered film 65 is not limited to the configuration described above. In addition, the Al like metal film 62 is also not limited to the Al-0.5% Cu film cited above.

Later on, by using the lithography technologies such as resist coating, exposure, development and baking as well as the etching technique, a portion of the layered film 65 indicated by a double-dotted line is removed to create the second wire 31 from the remaining portion of the layered film 65. At the same time, the compensation pattern 41 is created in the second wire 31 at a portion in close proximity to the connection hole 22 which portion has all but nothing to do with a path of a current flowing from the second wire 31 to the first wire 12. As shown in the figure, the length d of the compensation pattern 41 as measured from the connection hole 22 is greater than the margin w2 which allows for normal shift alignment of the second wire 31.

In addition, it is desirable to carry out the manufacturing processes described above, from the creation of the underlying Ti film 64 to the completion of the Al reflow process, in a completely vacuum environment or an environment of very pure inactive gas.

During the Al reflow process, a high-pressure reflow technique for applying a high pressure to the surface of the film being created can be adopted.

As described above, a connection hole is used as a means in the first to third embodiments for connecting the first wire 12 and the second wire 31 to each other. As for other connection holes such as connection holes for connecting the first wire 12 to an underlying device like a diffusion layer or an electrode of a transistor, a compensation pattern can be similarly created in the first wire 12.

In addition, the process for filling up the connection hole 22 is not limited to the one described above.

The same effect can be expected as long as a portion crossed by a current path exists in a layer of different types of metals each having a high electric conductivity and a high fusing point or a layer of compounds of such metals which metals are other than the Al like metal in the connection hole 22.

What is claimed is:

1. An Al like metal wiring disposed on one side of a dielectric film of a semiconductor device and connected to a metal layered film conductor, disposed on a surface on the other side of said dielectric film, through a connection hole drilled through said dielectric film, said Al like metal wiring comprising a wire and an Al like compensation pattern provided at a location proximate to said connecting hole and outside the direction of a current path running from the conductor through said connection hole to the wire, thereby enlarging a supplying source of Al atoms.

2. An Al like wiring according to claim 1, wherein said compensation pattern has a size larger than said connection hole, said size being sufficient to allow for alignment upon formation of said compensation pattern through an exposure process.

3. A semiconductor device comprising:

a substrate;

a first wire disposed over the substrate, comprising a layered film which includes a metal film comprising an Al—Cu material;

an insulator provided over the first wire, the insulator having a via formed therein, wherein a conductive plug is formed within the via;

a second wire comprising a material containing Al which is disposed over the insulator and connected to the conductive plug; and a compensation pattern provided at a location proximate to said via and outside the direction of a current path running from the conductor through said via to the second wire, the compensation pattern comprising a material containing Al, thereby enlarging a supplying source of Al atoms to the second wire.

4. The semiconductor device of claim 3, wherein the conductive plug comprises a material which differs from the material of the second wire.

5. The semiconductor device of claim 4, wherein the conductive plug comprises tungsten.

6. The semiconductor device of claim 3, wherein the second wire comprises a layered film.

7. The semiconductor device of claim 6, wherein the layered film of the second wire includes a metal film comprising an Al—Cu material.

8. The semiconductor device of claim 3, wherein the second wire overlaps the via by a sufficient margin to align the second wire relative to the via.

9. The semiconductor device of claim 8, wherein the margin is about 0.15 micrometers.

10. The semiconductor device of claim 8, wherein the length of the compensation pattern as measured from the via is greater than said margin.

11. The semiconductor device of claim 3, wherein the first wire is wider than the via by a sufficient margin to allow for normal alignment of a shift of the first wire relative to the via.

12. The semiconductor device of claim 11, wherein the margin is about 0.15 micrometers.

* * * * *